United States Patent [19]

Lee et al.

[11] Patent Number: 5,541,801
[45] Date of Patent: Jul. 30, 1996

[54] LOW-VOLTAGE GATE TRIGGER SCR (LVGTSCR) ESD PROTECTION CIRCUIT FOR INPUT AND OUTPUT PADS

[75] Inventors: Chung-Yuan Lee, Taoyuan Hsien; Chun-Yen Chang, Hsinchu, both of Taiwan

[73] Assignee: United Microelectronics Corporation, Hsinchu, Taiwan

[21] Appl. No.: 450,892

[22] Filed: May 26, 1995

[51] Int. Cl.⁶ .................................................. H02H 9/04
[52] U.S. Cl. .............................. 361/56; 361/111; 257/355
[58] Field of Search .................................. 257/355–363; 361/54, 56, 58–59, 91, 100, 111, 212

[56] References Cited

U.S. PATENT DOCUMENTS

| | | | |
|---|---|---|---|
| 4,595,941 | 6/1986 | Avery | 361/91 |
| 5,182,220 | 1/1993 | Ker et al. | 437/34 |

Primary Examiner—Jeffrey A. Gaffin
Assistant Examiner—Michael J. Sherry
Attorney, Agent, or Firm—Ladas & Parry

[57] ABSTRACT

An electrostatic discharge (ESD) protection circuit for eliminating the stress of electrostatic discharge and preventing destruction of an internal semiconductor circuit. A first low-voltage gate trigger silicon controlled rectifier anode and anode gate, a second low-voltage gate trigger silicon controlled rectifier anode gate and a third low-voltage gate trigger silicon controlled rectifier anode gate are each coupled to a reference high potential. A second low-voltage gate trigger silicon controlled rectifier cathode and cathode gate and a third low-voltage gate trigger silicon controlled rectifier anode are each coupled to a reference low potential. A first low-voltage gate trigger silicon controlled rectifier cathode, a second low-voltage gate trigger silicon controlled rectifier anode and a third low-voltage gate trigger silicon controlled rectifier cathode are each coupled to a wire connected between a semiconductor pad and the semiconductor circuit. A current-limiting resistor is connected between the semiconductor pad and a linked terminal of trigger gates of the first low-voltage gate trigger silicon controlled rectifier, the second low-voltage gate trigger silicon controlled rectifier and the third low-voltage gate trigger silicon controlled rectifier.

29 Claims, 4 Drawing Sheets

LOW-VOLTAGE GATE TRIGGER SCR (LVGTSCR) ESD PROTECTION CIRCUIT FOR INPUT AND OUTPUT PADS

BACKGROUND OF THE INVENTION

1. Field of the Invention

The present invention relates to an electrostatic discharge (ESD) protection circuit. More particularly, the present invention relates to an ESD protection circuit having a plurality of low-voltage gate trigger Silicon Controlled Rectifiers (SCRs) to eliminate electrostatic stress in semiconductor chip pads and avoid destruction of internal circuits.

2. Description of the Prior Art

The effect of electrostatic discharge (herein called ESD), which exists within an integrated circuit during the period of manufacture and use, is a severely destructive factor for an integrated circuit. The stress produced by ESD, passing through the pads of a chip to the internal circuits, may result in damage of the integrated circuit. Currently four models are used to explain the sources of ESD:

(1) the human body model, defined by the MIL-STD-883, Method 3015.6, which refers to the ESD stress produced by the human body carrying electrostatic touching the pins of a integrated circuit;

(2) the machine model, followed by the test of the present industrial standard EIAJ-IC-121, Method 20, which refers to a machine carrying an electrostatic charge touching the pins of a integrated circuit;

(3) the charged device model, which refers to an originally charged integrated circuit, which in subsequent steps contacts a conductive material to ground, resulting in an ESD impulse passing through the integrated circuit; and (4) the field-induced model, which refers to an electrostatic field inducing a potential between an integrated circuit and ground, then discharging to ground during the process of measuring and packaging.

Sometimes, an ESD protection circuit is coupled to the wire between the pads and the internal circuits to reduce the failure rate of integrated circuits caused by ESD stress and to ensure the reliability of the integrated circuits. In CMOS circuits, a protection circuit is usually implemented by a lateral silicon controlled rectifier (LSCR). Compatibility with the manufacturing process of a CMOS integrated circuit is the main advantage of this technology. But, for a 0.6–0.8 µ/n submicron CMOS, the thickness of a gate oxide layer is about 150–200 µm. If the field strength of breakdown, for example, is about 10 MV/cm2 in a dielectric SiO2, the gate oxide layer will be damaged under 15–20 V. Therefore, LSCR devices, whose trigger voltage is about 30–50 V, must be protected with additional protection devices to prevent the breakdown of the gate oxide layer.

LSCR devices can constitute the ESD protection circuit. However, especially in a submicron process, the trigger voltage of a parasitic LSCR device is much larger than the breakdown voltage of the gate oxide layer due to shrinkage of the device size, so it can not provide adequate ESD protection. A parasitic LSCR having a low trigger voltage is necessary to prevent the above phenomenon. A methodology described in the article entitled "A low-voltage triggering SCR for on-chip ESD protection at output and input pads", in proc. 1990 Symposium on VLSI Tech., pp. 75–56, by A. Chatterjee and T. Polgreen, adopts a novel low-voltage trigger SCR (LVTSCR) to improve upon the drawbacks of a conventional LSCR device. The LVTSCR device having the lower trigger voltage includes a traditional LSCR device and an NMOS short channel transistor. The phenomena of snapback breakdown, which is distinctive of the LVTSCR device, is applied to reduce the trigger voltage of the LVTSCR device to the breakdown voltage (BVdss) of the short channel NMOS transistor.

While an ESD protection circuit consisting of a conventional LVTSCR device provides an apparent improvement of the trigger voltage, nonetheless, there are still limitations in its application as the ESD protection circuit in a integrated circuit.

To help understand the limitations, the various forms of ESD stress need to be briefly discussed. For a reference high potential VDD and a reference low potential VSS (or ground), the ESD stress can be classified as positive polarity or negative polarity. Accordingly, on every pad in a general integrated circuit, four different modes of ESD stress can be identified as:

(a) PS (positive source) mode, wherein the ESD stress has positive polarity potential with respect to the reference low potential VSS, with the terminal of the reference high potential VDD floating;

(b) NS (negative source) mode, wherein the ESD stress has negative polarity potential with respect to the reference low potential VSS, with the terminal of the reference high potential VDD floating;

(c) PD (positive drain) mode, wherein the ESD stress has positive polarity potential with respect to the reference high potential VDD, with the terminal of the reference low potential VSS floating;

(d) ND (negative drain) mode, wherein the ESD stress has negative polarity potential with respect to the reference high potential VDD, with the terminal of the reference low potential VSS floating.

MOS transistors in a input stage or an output driver of an integrated circuit may be damaged by means of any of the above-mentioned four modes of the ESD stress. The ESD protection circuit in the conventional technology is located between the pad and the reference low potential VSS and there is no direct discharge path between the pad and the reference high potential VDD. In the case of the PD mode and ND mode of ESD stress, for example, there is a potential of positive or negative polarity for the ESD stress between the pad and the reference high potential VDD when the reference low potential VSS is floating. This potential of the ESD stress will be discharged through the following path: the pad, the LVTSCR device in the ESD protection circuit, the reference low potential VSS, another protection circuit between the reference low voltage and the reference high voltage, and the reference high potential VDD. However, there are many parasitic resistors and capacitors within the power line. Therefore an indirect discharge due to the parasitic effect may be harmful to the internal circuitry of the integrated circuit.

Although the trigger voltage is reduced to the breakdown voltage of the short channel NMOS transistor, LVGTSCR devices provide insufficient protection since we cannot make sure whether the ESDstress has been bypassed through the ESD protection circuit and is harmless to the input stage and output driving stage.

Further, since integration and shrinkage is the main future trend in integrated circuit, a conventional ESD protection circuit using LVGTSCR devices is inappropriate for the submicron process and low-voltage ICs because of the difficulty in adjusting the trigger voltage.

Finally, the LVTSCR device chooses the snapback mode of a short channel NMOS transistor as the operation mode for bypassing ESD. However, this operation mode is not the best one for protecting from ESD for limited current capability.

SUMMARY OF THE INVENTION

Since conventional ESD protection circuits will have limited application in the future, a first object of the present invention is to provide a novel ESD protection circuit capable of handling the four models of ESD stress, especially the PD mode and the ND mode.

A second object of the present invention is to provide an ESD protection circuit, the trigger voltage of which can be modified appropriately with respect to the various input and output pads, to ensure the reliability and safety of pads.

A third object of the present invention is to provide an ESD protection circuit, the trigger voltage of which can be easily adjusted with respect to the reduced voltage levels resulting from the shrinkage of integrated circuits, to meet the future requirements.

A fourth object of the present invention is to provide an ESD protection circuit which adopts the turn-on mode of the short channel NMOS transistor as the operation mode instead of the snapback mode, to provide the most ESD protection performance while requiring less layout area than the conventional LSCR.

In accordance with the present invention an electrostatic discharge (ESD) protection circuit is provided for eliminating the stress of electrostatic discharge and preventing destruction of an internal semiconductor circuit. A first low-voltage gate trigger silicon controlled rectifier anode and anode gate, a second low-voltage gate trigger silicon controlled rectifier anode gate and a third low-voltage gate trigger silicon controlled rectifier anode gate are each coupled to a reference high potential. A second low-voltage gate trigger silicon controlled rectifier cathode and cathode gate and a third low-voltage gate trigger silicon controlled rectifier anode are each coupled to a reference low potential. A first low-voltage gate trigger silicon controlled rectifier cathode, a second low-voltage gate trigger silicon controlled rectifier anode and a third low-voltage gate trigger silicon controlled rectifier cathode are each coupled to a wire connected between a semiconductor pad and the semiconductor circuit. A current-limiting resistor is connected between the semiconductor pad and a linked terminal of trigger gates of the first low-voltage gate trigger silicon controlled rectifier, the second low-voltage gate trigger silicon controlled rectifier and the third low-voltage gate trigger silicon controlled rectifier.

In particular, a low-voltage gate trigger silicon controlled rectifier (LVGTSCR), which combines the conventional LVTSCR device with the gate triggering circuit used to control the trigger voltage of the ESD protection circuit and to keep the turn-on state of the short channel transistor, is selected and constitutes the ESD protection circuit in the present invention. The gate trigger circuit includes a string of transistors connected to each other serially, and the trigger voltage of the ESD protection circuit depends on the amount of the transistors and can be easily modified. In this way, the four modes of ESD stress in the pads can be treated by means of different discharge passages, such as a LVGTSCR device or a diode, to protect the internal circuit from the ESD stress.

THE PREFERRED EMBODIMENT

Figure 1:
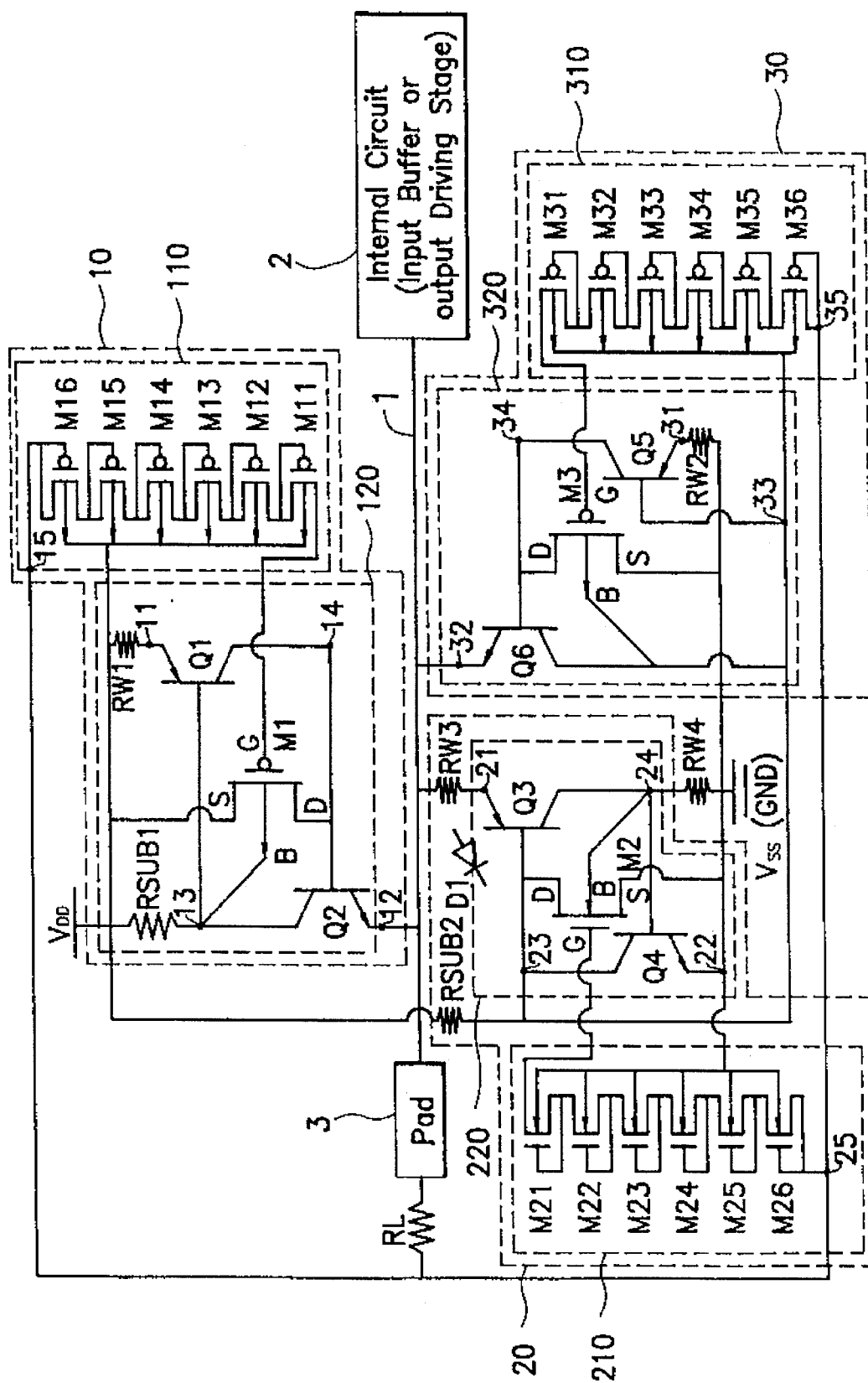
FIG. 1 is a detailed circuit diagram of the preferred embodiment of the present invention.

Referring to FIG. 1, an ESD protection circuit using LVGTSCR devices is shown. The ESD protection circuit is connected to wire 1 coupled between pad 3 and internal circuit 2 (an internal circuit such as an input buffer or output driving stage). The ESD protection circuit includes four components: first LVGTSCR device 10, a second LVGTSCR device 20, a third LVGTSCR device, and a current limit resistor RL.

First LVGTSCR device 10 includes first gate triggering circuit 110 and first LVTSCR device 120. First LVGTSCR device 10 further includes five nodes: anode 11, cathode 12, anode gate 13, cathode gate 14 and trigger gate 15. First gate triggering circuit 110 consists of six PMOS transistors M11–M16 connected to each other serially. The linked gate and source of transistor M11 are coupled to the drain of transistor M12. The linked gate and source of transistor M12 are coupled to the drain of transistor M13, and so on. The bulks of transistors M11–M16 are coupled to reference high potential VDD Hereafter, we shall refer to the drain of transistor M11 as the positive terminal of first gate triggering circuit 110, and the connecting terminal of the gate and source of transistor M16 as the negative terminal (also trigger gate 15 of LVGTSCR 10). First LVTSCR device 120 consists of an LSCR, which includes first pnp bipolar transistor Q1, second npn bipolar transistor Q2 and first short channel PMOS transistor MI. The base of bipolar transistor Q1 is connected to the collector of the bipolar transistor Q2 at anode gate 13. The collector of the bipolar transistor Q1 is connected to the base of bipolar transistor Q2 at cathode gate 14. Anode 11, which is at the emitter of bipolar transistor Q1, and anode gate 13 are coupled to reference high potential VDD. Cathode 12, which is at the emitter of bipolar transistor Q2, is coupled to wire 1. Gate G, source S, drain D, and bulk B of transistor M1 are coupled to the positive terminal of first gate triggering circuit 110, reference high potential VDD, cathode gate 14, and anode gate 13, respectively.

Second LVGTSCR device 20 includes second gate triggering circuit 210 and second LVTSCR device 220. Second LVGTSCR device 20 further includes five nodes: anode 21, cathode 22, anode gate 23, cathode gate 24 and trigger gate 25. Second gate triggering circuit 210 consists of six NMOS transistors M21–M26 connected to each other serially. The linked gate and source of transistor M21 are coupled to the drain of transistor M22. The linked gate and source of transistor M22 are coupled to the drain of the transistor M23, and so on. The bulks of transistors M21–M26 are coupled to reference low potential VSS. Hereafter, we shall refer to the drain of transistor M21, as the positive terminal of second gate triggering circuit 210, and the linked terminal of the gate and source of transistor M26 as the negative terminal (also trigger gate 25 of LVGTSCR 20). Second LVTSCR device 220 consists of an LSCR, which includes third pnp bipolar transistor Q3, fourth npn bipolar transistor Q4 and first short-channel NMOS transistor M2. Anode gate 23, which is the connecting terminal of the base of bipolar transistor Q3, and the collector of the bipolar transistor Q4, is coupled to the reference high potential VDD. Cathode gate 24, which is the connecting terminal of the base of bipolar transistor Q4, and the collector of the bipolar transistor Q3, is coupled to the reference low potential VSS Anode 21, which is the emitter of bipolar transistor Q3, is coupled to the wire 1. Cathode 22, which is the emitter of bipolar transistor Q4, is coupled to the reference low potential VSS. Gate G, source S, drain D and bulk B of transistor M2 are coupled to the positive terminal of second gate triggering circuit 210, reference low potential VSS, anode gate 23, and cathode gate 24, respectively.

Third LVGTSCR device 30 includes third gate triggering circuit 310 and third LVTSCR device 320. Third LVGTSCR device 30 further includes five nodes: anode 31, cathode 32, anode gate 33, cathode gate 34 and trigger gate 35. Third gate triggering circuit 310 consists of six PMOS transistors M31–36 connected to each other serially. The linked gate and source of transistor M31 are coupled to the drain of transistor M32. The linked gate and source of transistor M32 are coupled to the drain of the transistor M33, and so on. The bulks of transistors M31–M36 are coupled to a reference high potential VDD Hereafter, we shall refer to the drain of transistor M31 as the positive terminal of third triggering gate circuit 310, and the linked terminal of the gate and source of transistor M36 as the negative terminal (also trigger gate 35 of LVGTSCR 30). Third LVTSCR device 320 consists of an LSCR, which includes fifth pnp bipolar transistor Q5, sixth npn bipolar transistor Q6 and second short-channel PMOS transistor M3. The base of bipolar transistor Q5 is connected to the collector of the bipolar transistor Q6 at anode gate 33. The collector of the bipolar transistor Q5 connected to the base of the bipolar transistor Q6 at cathode gate 34. The emitter of bipolar transistor Q1, which is constructed as the anode 31, is coupled to the reference low potential VSS. The emitter of bipolar transistor Q6, which is constructed as the cathode 32, is coupled to the wire 1. The gate G, source S, drain D, and bulk B of the transistor M3 are coupled to the positive terminal of the third gate triggering circuit 310, the reference low potential VSS, the cathode gate 34, and anode gate 33, respectively.

Current-limiting resistor RL is used for preventing all gate triggering circuits 110, 210, 310 from accidental damage resulting from unexpected ESD stress. One end of current-limiting resistor RL is coupled to pad 3 and the other end is coupled to the negative terminals of first gate triggering circuit 110, second gate triggering circuit 210 and third gate triggering circuit 310. As the layout area is reduced in scale, the gate triggering circuit is susceptible to ESD and current-limiting resistor RL is used to protect these circuits.

In FIG. 1, other resistors RW1, RW2, RW3, RW4, RSUB1 and RSUB2 are all parasitic resistors in the semiconductor material.

The methodology by which the ESD protection circuit of the present invention maintains the security of the internal circuit is described and discussed according to the four modes of ESD stress:

PS mode

Reference high potential VDD is floating and the ESD stress on pad 3 must be discharged through second LVGTSCR 20. The discharge path begins from anode 21 to anode gate 23 via the emitter-base forward bias of bipolar transistor Q3, to cathode gate 24 via the drain and the bulk of MOS transistor M2 if MOS transistor M2 is in the turn-on state, and finally to cathode 22 through the base-emitter forward bias of bipolar transistor Q4, which is coupled to the reference low voltage VSS. According to the above description, the trigger voltage of second LVGTSCR 20 triggers MOS transistor M2 into the turn-on state. Pad 3 is coupled to the gate of MOS transistor M2 by means of current-limiting resistor RL and MOS transistors M26–M21 of gate triggering circuit 210. So, all MOS transistors M21–M26 and M2 must be in the turn-on state. Since the turn-on voltage of a single transistor is about 1.0–1.5 V, then, the trigger voltage is between 7.0 V–10.5 V approximately for the total of seven MOS transistors in this embodiment. When the trigger condition is maintained, the SCR consisting of bipolar transistors Q3 and Q4 will be in the latchup state and further settles the ESD voltage to be about 1–2 V for protecting internal circuit 2. The trigger voltage depends on the number of the MOS transistors within the gate triggering circuit. In any case, the MOS transistors do not require very much layout area and, therefore, overall chip area is not wasted.

NS mode

Reference high potential VDD is floating and the ESD stress on pad 3 must be discharged through third LVGTSCR 30. The principles of operation in the NS mode are similar to those of the PS mode. The discharge passage begins from anode 31 to cathode 32 via anode gate 33 and cathode gate 34. A trigger voltage of about 7.0 V–10.5 V can turn on MOS transistors M31–36 and M3. Similarly, the amount of trigger voltage depends on the number of MOS transistors.

PD mode

Reference low potential VSS is floating and the ESD stress on pad 3 must be discharged by means of diode D1, which is formed by the emitter-base junction of third pnp bipolar transistor Q3. So, the trigger voltage is equivalent to the forward bias of diode D1.

ND mode

Reference low potential VSS is floating and the ESD stress on pad 3 must be discharged by means of first LVGTSCR 10. The operating principles in the ND mode are in some ways similar to those in the PS mode. The discharge passage begins from anode 11 to cathode 12 via anode gate 13 and cathode gate 14. A trigger voltage of about 7.0–10.5 V can turn on MOS transistors M11–M16 and M1. Similarly, the amount of trigger voltage depends on the number of MOS transistors in gate triggering circuit 110.

Figure 4:
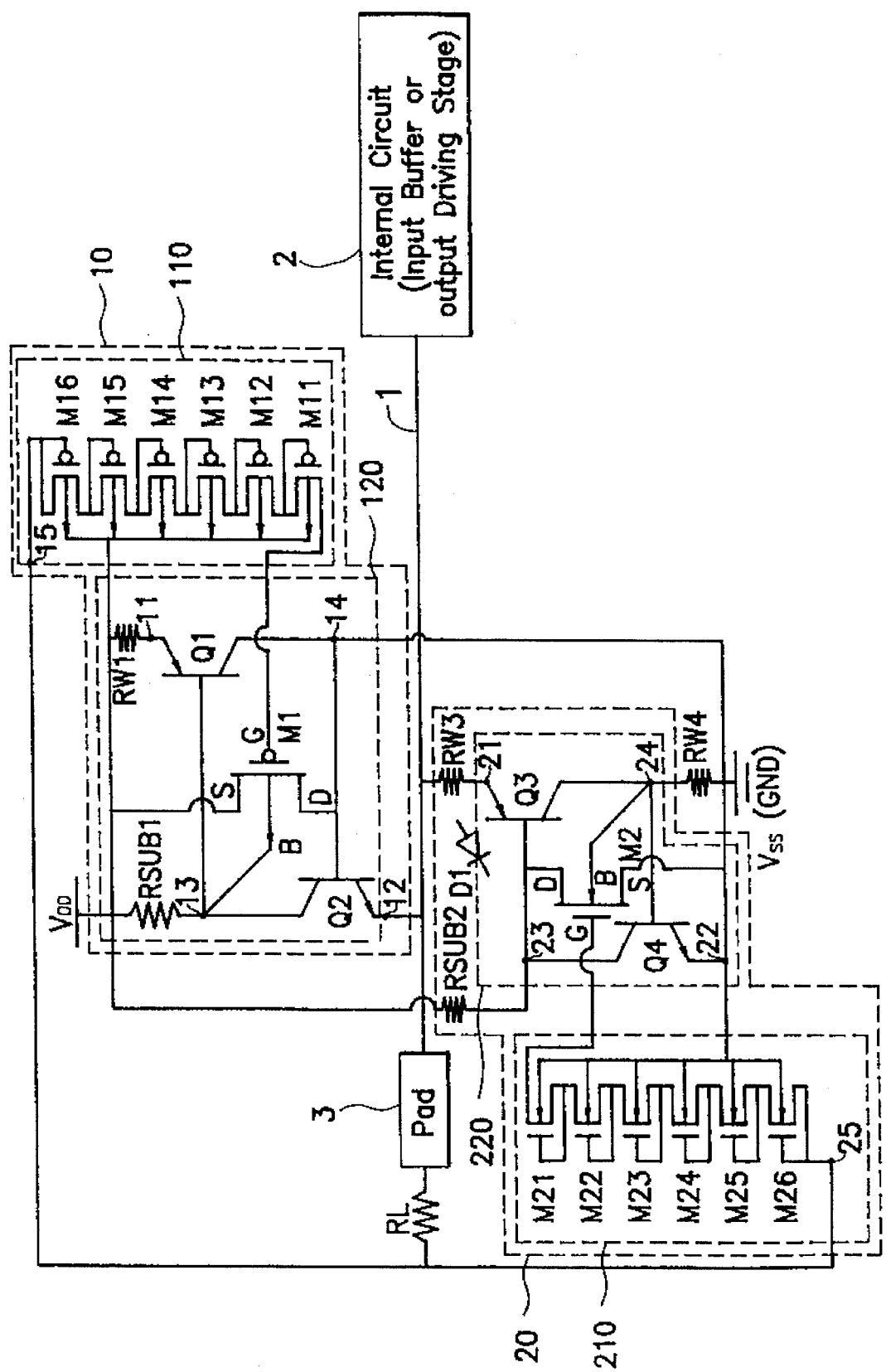
FIG. 4 is an alternative circuit diagram of the preferred embodiment of the present invention.

The base and the emitter of the bipolar transistor Q2 constituting a diode can substantially deal with the NS mode of the ESD discharge, similar to the diode D1 with the PD mode. Therefore, the diode resulting from the bipolar transistor Q2 can be used to replace the LVGTSCR 30. The resulting circuit block diagram is shown in FIG. 4. In fact, after experiments, the performance of the diode formed by the base and emitter of bipolar transistor Q2 is poor. Similarly, the function of the diode D1 is also can be replaced by a LVGTSCR device, which is coupled between wire 1 and reference high potential VDD. However, the performance of diode D1 is pretty good. Therefore, we adapt the optimal configuration of FIG. 1, one reason for achieving better performance (the LVGTSCR device 30), another for saving the chip area (the diode D1).

Figure 2:
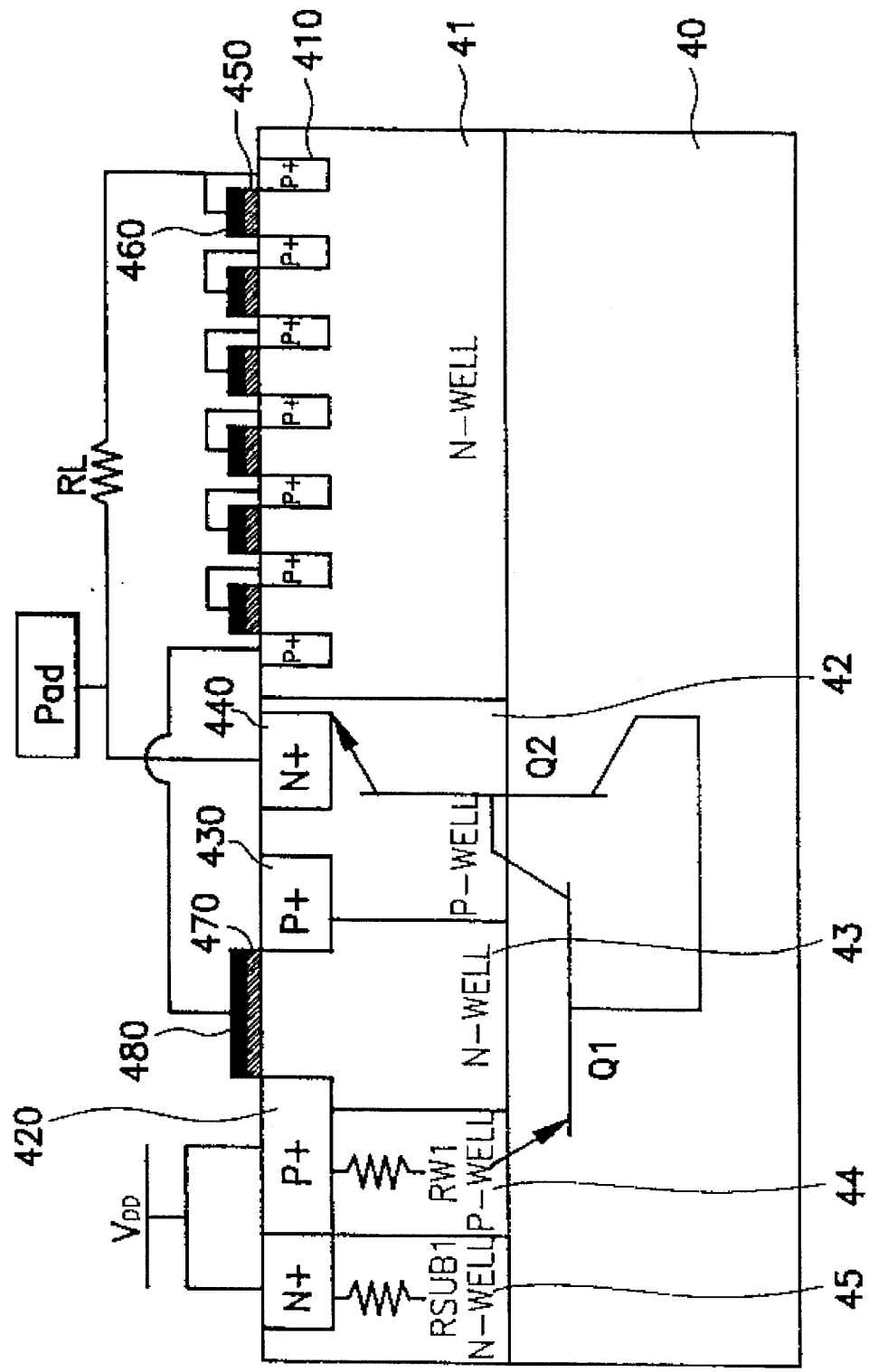
FIG. 2 is a cross-sectional layout diagram of the first LVGTSCR device of the preferred embodiment of the present invention.
Figure 3:
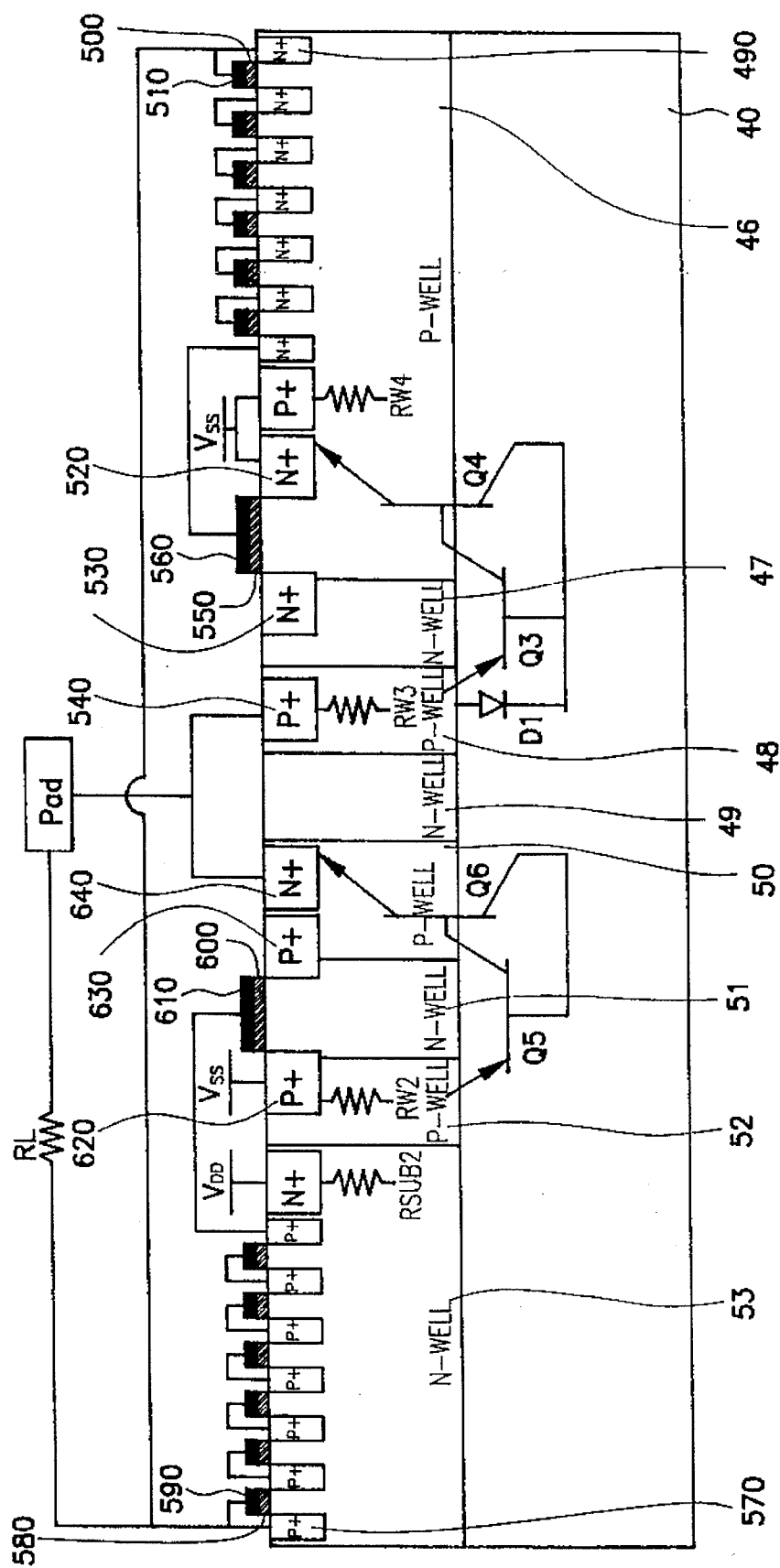
FIG. 3 is a cross-sectional layout diagram of the second LVGTSCR device and the third LVGTSCR device of the preferred embodiment of the present invention.

Referring to FIG. 2 and FIG. 3, FIG. 2 is the cross-sectional layout diagram of first LVGTSCR 10 of the protection circuit and FIG. 3 is the cross-sectional layout diagram of second and third LVGTSCR 20, 30 of the protection circuit. In FIG. 2, first n-well 41, first p-well 42, second n-well 43, second p-well 44, and third n-well 45 are formed adjacently onto n-substrate 40 by means of the twin well process. Similarly in FIG. 3, third p-well 46, fourth n-well 47, fourth p-well 48, fifth n-well 49, fifth p-well 50, sixth n-well 51, sixth p-well 52, and seventh n-well 53 are formed adjacently onto the n-substrate 40.

The layout structure of first LVGTSCR 10 is described, referring to both FIGS. 1 and 2. A string of p-type heavy-doped regions 410 are located on n-well 41. A plurality of gate structures, including gate oxide layers 450 and gate electrodes 460 located on n-well 41 between p-type heavy-doped regions 410, form first gate triggering circuit 110. First n-type heavy-doped region 440 is located on p-well 42. First p-type heavy-doped region 430 is located on the interface of p-well 42 and n-well 43. Second p-type heavy-doped region 420 is located on the interface of n-well 43 and p-well 44. A cascaded structure of gate oxide layer 470 and gate electrode 480, located on n-well 43 between p-type heavy-doped region 420 and p-type heavy doped region 430, form the gate structure of MOS transistor M1, wherein resistor RW1 and RSUB1 are the parasitic resistors in p-well 44 and n-well 45, respectively. In addition, p-well 44, n-substrate 40 and p-well 42 form an emitter, a collector, and a base of pnp bipolar transistor Q1, respectively. N-type heavy-doped region 440, p-well 42, and n-substrate 40 form an emitter, a collector, and a base of npn bipolar transistor Q2, respectively.

The layout structure of second LVGTSCR 20 is shown referring to FIGS. 1 and 3. A string of n-type heavy-doped regions 490 are located on a p-well 46. A plurality of gate structures including gate oxide layers 500 and gate electrodes 510, located on p-well 46 between n-type heavy-doped regions 490, form second gate triggering circuit 210. Second n-type heavy-doped region 520 is located on p-well 46. Third n-type heavy-doped region 530 is located on the interface of p-well 46 and n-well 47. Third p-type heavy-doped region 540 is located on p-well 48. A cascaded structure of gate oxide layer 550 and gate electrode 560 located on p-well 46 between n-type heavy-doped region 530 and n-type heavy-doped region 520 forms the gate structure of MOS transistor M2, wherein resistors RW3 and RW4 are the parasitic resistors in p-well 48 and p-well 46, respectively. P-well 48, n-substrate 40 and p-well 46 form an emitter, a base, and a collector of pnp bipolar transistor Q3, respectively. N-type heavy-doped region 520, p-well 46, and n-substrate 40 form an emitter, a base, and a collector of npn bipolar transistor Q4, respectively. P-well 48 and n-substrate 40, which is the emitter and base of bipolar transistor Q3, are formed as diode D1.

The layout structure of third LVGTSCR 30 is shown referring to FIGS. 1 and 3. A string of p-type heavy-doped regions 570 is located on n-well 53. A plurality of gate structures, including gate oxide layers 580 and gate electrodes 590 located on n-well 53 between n-type heavy-doped regions 570, form third gate triggering circuit 310. Fourth p-type heavy-doped region 620 is located on the interface of p-well 52 and n-well 51. Fifth p-type heavy-doped region 630 is located on the interface of p-well 50 and n-well 51. Fourth n-type heavy-doped 640 is located on p-well 50. A cascaded structure of gate oxide layer 600 and gate electrode 610 located on n-well 51 between p-type heavy-doped region 620 and p-type heavy-doped region 630 forms MOS transistor M3, wherein resistors RW2 and RSUB2 are the parasitic resistors in p-well 52 and p-well 53, respectively. P-well 52, n-substrate 40, and p-well 50 form an emitter, a base, and a collector of pnp bipolar transistor Q5, respectively. N-type heavy-doped region 640, p-well 50 and n-substrate 40 form an emitter, a base, and a collector of npn bipolar transistor Q6, respectively.

The above embodiment is made on a n-substrate, by means of the twin well process. Those skilled in the art can appreciate the structure of a comparable embodiment using a p-substrate process.

Therefore, the present invention provides a better scheme to handle the four modes of ESD stress by:

(1) the complementary LVGTSCR device and the parasitic diode performing the ESD protection function;

(2) the adjustment of the trigger voltage in the ESD protection circuit being easily achieved by modifying the number of the MOS transistors in the gate trigger circuit during the period of design; and (3) MOS transistors controlling the trigger voltage are in the turn-on state.

The foregoing description of preferred embodiments the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the act to understand the invention for various embodiments and with various modifications as are suited to the particular use contemplated. It is intended that the scope of the invention be defined by the following claims and their equivalents.

What is claimed is:

1. A protection circuit, located on a wire between an internal circuit and a pad, for preventing the internal circuit from damage due to electrostatic discharge through the pad, comprising:

a reference high potential;

a reference low potential;

a first low-voltage gate trigger silicon controlled rectifier for protecting the internal circuit against the effects of the negative drain mode of electrostatic discharge, the first low-voltage gate trigger silicon controlled rectifier having a first low-voltage gate trigger silicon controlled rectifier anode, a first low-voltage gate trigger silicon controlled rectifier anode gate, a first low-voltage gate trigger silicon controlled rectifier cathode, a first low-voltage gate trigger silicon controlled rectifier cathode gate, and a first low-voltage gate trigger silicon controlled rectifier trigger gate;

a second low-voltage gate trigger silicon controlled rectifier for protecting the internal circuit against the effects of the positive source mode and the positive drain mode of electrostatic discharge, the second low-voltage gate trigger silicon controlled rectifier having a second low-voltage gate trigger silicon controlled rectifier anode, a second low-voltage gate trigger silicon controlled rectifier anode gate, a second low-voltage gate trigger silicon controlled rectifier cathode, a second low-voltage gate trigger silicon controlled rectifier cathode gate and a second low-voltage gate trigger silicon controlled rectifier trigger gate;

a third low-voltage gate trigger silicon controlled rectifier for protecting the internal circuit against the effects of the negative source mode of electrostatic discharge, the third low-voltage gate trigger silicon controlled rectifier having a third low-voltage gate trigger silicon controlled rectifier anode, a third low-voltage gate trigger silicon controlled rectifier anode gate, a third low-voltage gate trigger silicon controlled rectifier cathode, a third low-voltage gate trigger silicon controlled rectifier cathode gate, and a third low-voltage gate trigger silicon controlled rectifier trigger gate, wherein:

the first low-voltage gate trigger silicon controlled rectifier anode, the first low-voltage gate trigger silicon controlled rectifier anode gate, the second low-voltage gate trigger silicon controlled rectifier anode gate and the third low-voltage gate trigger silicon controlled rectifier anode gate each being coupled to said reference high potential, the second low-voltage gate trigger silicon controlled rectifier cathode, the second low-voltage gate trigger silicon controlled rectifier cathode gate and the third low-voltage gate trigger silicon controlled rectifier anode each being coupled to said reference low potential, the first low-voltage gate trigger silicon controlled rectifier cathode, the second low-voltage gate trigger silicon controlled rectifier anode and the third low-voltage gate trigger silicon controlled rectifier cathode each being coupled to said wire; and, a current-limiting resistor for protecting against unexpected electrostatic discharge, the current-limited resistor being connected between the pad and a linked terminal of trigger gates of said first low-voltage gate trigger silicon controlled rectifier, a linked terminal of trigger gates of said second low-voltage gate trigger silicon controlled rectifier and a linked terminal of trigger gates of said third low-voltage gate trigger silicon controlled rectifier.

2. The protection circuit of claim 1, wherein said first low-voltage gate trigger silicon controlled rectifier includes:

a first silicon controlled rectifier for providing the discharge path of the negative drain mode of electrostatic discharge, the having a first silicon controlled rectifier anode, a first silicon controlled rectifier anode gate, a first silicon controlled rectifier cathode and a first silicon controlled rectifier cathode gate, wherein the first silicon controlled rectifier anode, the first silicon controlled rectifier anode gate, the first silicon controlled rectifier cathode, and the first silicon controlled rectifier cathode gate form the first low-voltage gate trigger silicon controlled rectifier anode, the first low-voltage gate trigger silicon controlled rectifier anode gate, the first low-voltage gate trigger silicon controlled rectifier cathode, and the first low-voltage gate trigger silicon controlled rectifier cathode gate, respectively;

a first PMOS transistor for triggering the discharge path of the negative drain mode of electrostatic discharge, wherein a source of said first PMOS transistor is coupled to the first silicon controlled rectifier anode, a drain of said first PMOS transistor is coupled to the first silicon controlled rectifier cathode gate and a bulk of said first PMOS transistor is coupled to the first silicon controlled rectifier anode gate of said; and a first gate triggering circuit for controlling the trigger voltage of said first low-voltage gate trigger silicon controlled rectifier, the first gate triggering circuit having a first gate triggering circuit positive terminal and a first gate triggering circuit negative terminal, the first gate triggering circuit negative terminal being coupled to a gate of said first PMOS transistor.

3. The protection circuit of claim 2, wherein said first silicon controlled rectifier includes:

a first pnp transistor, having a first pnp transistor base, a first pnp transistor emitter, and a first pnp transistor collector; and a second npn transistor, having a second npn transistor base, a second npn transistor emitter and a second npn transistor collector, wherein the first pnp transistor base is coupled to the second npn transistor collector to form the first silicon controlled rectifier anode gate, the first pnp transistor collector is coupled to the second npn transistor base to form the first silicon controlled rectifier cathode gate, and the first pnp transistor emitter and the second npn transistor emitter are the first silicon controlled rectifier anode and the first silicon controlled rectifier cathode, respectively.

4. The protection circuit of claim 2, wherein said first gate triggering circuit includes at least one first short channel PMOS transistor, each having a joint source-gate and a drain and linked serially by connecting the joint source-gate of each first short channel PMOS transistor to the drain of a previous first short channel PMOS transistor and the drain of each first short channel PMOS transistor to the joint source-gate of a subsequent first short channel PMOS transistor, wherein a suspended joint source-gate of the leading first short-channel PMOS transistor forms the first gate triggering circuit positive terminal and a suspended drain of the last first short channel PMOS transistor forms the first gate triggering circuit negative terminal.

5. The protection circuit of claim 1, wherein said second low-voltage gate trigger silicon controlled rectifier includes:

a second silicon controlled rectifier for providing the discharge path of the positive source mode of electrostatic discharge, the second silicon controlled rectifier having a second silicon controlled rectifier anode, a second silicon controlled rectifier anode gate, a second silicon controlled rectifier cathode, and a second silicon controlled rectifier cathode gate, wherein the second silicon controlled rectifier anode, the second silicon controlled rectifier anode gate, the second silicon controlled rectifier cathode, and the second silicon controlled rectifier cathode gate form the second low-voltage gate trigger silicon controlled rectifier anode, the second low-voltage gate trigger silicon controlled rectifier anode gate, the second low-voltage gate trigger silicon controlled rectifier cathode, and the second low-voltage gate trigger silicon controlled rectifier cathode gate, respectively;

a first NMOS transistor for triggering the discharge path of the positive source mode of electrostatic discharge, wherein a source of said first NMOS transistor is coupled to the second silicon controlled rectifier cathode, a drain of said first NMOS transistor is coupled to the second silicon controlled rectifier anode gate and the bulk of said first NMOS transistor is coupled to the second silicon controlled rectifier cathode gate; and a second gate triggering circuit for controlling the trigger voltage of said second low-voltage gate trigger silicon controlled rectifier, the second gate triggering circuit having a second gate triggering circuit positive terminal and a second gate triggering circuit negative terminal, the second gate triggering circuit negative terminal being coupled to the gate of said first NMOS transistor.

6. The protection circuit of claim 5, wherein said second silicon controlled rectifier includes:

a third pnp transistor, having a third pnp transistor base, a third pnp transistor emitter and a third pnp transistor collector; and a fourth npn transistor, having a fourth npn transistor base, a fourth npn transistor emitter and a fourth npn transistor collector, wherein the third pnp transistor base is coupled to the fourth npn transistor collector to form the second silicon controlled rectifier anode gate, the third pnp transistor collector is coupled to the fourth npn transistor base to form the second silicon controlled rectifier cathode gate, and the third pnp transistor emitter and the fourth npn transistor emitter are the second silicon controlled rectifier anode and the second silicon controlled rectifier cathode, respectively.

7. The protection circuit of claim 6, wherein said second silicon controlled rectifier includes a diode for protecting the internal circuit against the effect of the positive drain mode of electrostatic discharge, said diode being formed by the third pnp transistor base and the third pnp transistor emitter.

8. The protection circuit of claim 5, wherein said second gate triggering circuit includes at least one short-channel NMOS transistor, each having a joint source gate as well as a drain and linked serially by connecting the joint source-gate of each short channel NMOS transistor to the drain of a previous short channel NMOS transistor and the drain of each short channel NMOS transistor to the joint source-gate of a subsequent short channel NMOS transistor, and wherein a suspended joint source-gate of a leading short-channel NMOS transistor forms the second gate triggering circuit positive terminal and a suspended drain of a last short-channel NMOS transistor forms the second gate triggering circuit negative terminal.

9. The protection circuit of claim 1, wherein said third low-voltage gate trigger silicon controlled rectifier includes:

a third silicon controlled rectifier for providing the discharge path of the negative source mode of electrostatic discharge, the third silicon controlled rectifier having a third silicon controlled rectifier anode, a third silicon controlled rectifier anode gate, a third silicon controlled rectifier cathode, and a third silicon controlled rectifier cathode gate, wherein the third silicon controlled rectifier anode, the third silicon controlled rectifier anode gate, the third silicon controlled rectifier cathode, and the third silicon controlled rectifier cathode gate form the third low-voltage gate trigger silicon controlled rectifier anode, the third low-voltage gate trigger silicon controlled rectifier anode gate, the third low-voltage gate trigger silicon controlled rectifier cathode, and the third low-voltage gate trigger silicon controlled rectifier cathode gate, respectively;

a second PMOS transistor for triggering the discharge path of the negative source mode of electrostatic discharge, wherein a source of said second PMOS transistor is coupled to the third silicon controlled rectifier anode, the drain of said second PMOS transistor is coupled to the third silicon controlled rectifier cathode gate, and the bulk of said second PMOS transistor is coupled to the third silicon controlled rectifier anode gate; and a third gate triggering circuit for controlling the trigger voltage of said third low-voltage gate trigger silicon controlled rectifier, the third gate triggering circuit having a third gate triggering circuit positive terminal and a third gate triggering circuit negative terminal, the third gate triggering circuit negative terminal of said third gate triggering circuit being coupled to the gate of said second PMOS transistor.

10. The protection circuit of claim 9, wherein said third silicon controlled rectifier includes:

a fifth pnp transistor, having a fifth pnp transistor base, a fifth pnp transistor emitter and a fifth pnp transistor collector;

a sixth npn transistor, having a sixth npn transistor base, a sixth npn transistor emitter and a sixth npn transistor collector;

wherein the fifth pnp transistor base is coupled to the sixth npn transistor collector to form the third silicon controlled rectifier anode gate, the fifth pnp transistor collector is coupled to the sixth npn transistor base to form the third silicon controlled rectifier cathode gate, and the fifth pnp transistor emitter and the sixth npn transistor emitter are the third silicon controlled rectifier anode and the third silicon controlled rectifier cathode, respectively.

11. The protection circuit of claim 9, wherein said third gate triggering circuit includes at least one second short channel PMOS transistor, each having a joint source-gate as well as a drain and linked serially by connecting the joint source-gate of each second short channel PMOS transistor to the drain of a previous second short channel PMOS transistor and the drain of each second short channel PMOS transistor to the joint source-gate of a subsequent second short channel PMOS transistor, and wherein a suspended joint source-gate of a leading second short channel PMOS transistor forms the third gate triggering circuit positive terminal and a suspended drain of a last second short-channel PMOS transistor forms the third gate triggering circuit negative terminal.

12. The protection circuit of claim 1, wherein said first low-voltage gate trigger silicon controlled rectifier is located on a substrate of a first type, the substrate of the first type including:

a first well of the first type located on the substrate of the first type;

a first well of a second type located on the substrate of the first type, adjacent to said first well of the first type;

a second well of the first type located on the substrate of the first type, adjacent to said first well of the second type;

a second well of the second type located on the substrate of the first type, adjacent to said second well of the first type;

a plurality of heavy-doped regions of the second type, sequentially spaced apart for a distance between each other, located on said first well of the first type;

a plurality of gate structures, each having a gate oxide and a gate electrode, located on the space of said first well of the first type between both of said heavy-doped regions of the second type;

a first heavy-doped region of the first type, located on said first well of the second type;

a first heavy-doped region of the second type, located on a junction of said first well of the second type and said second well of the first type;

a second heavy-doped region of the second type, located on a junction of said second well of the first type and said second well of the second type; and a first gate structure, having a gate oxide and a gate electrode, located between said first heavy-doped region of the second type and said second heavy-doped region of the second type.

13. The protection circuit of claim 12, wherein said first well of the second type, the substrate of the first type and said second well of the second type form a first bipolar transistor collector, a first bipolar transistor base, and a first bipolar transistor emitter, respectively.

14. The protection circuit of claim 12, wherein the substrate of the first type, said first well of the second type, and said first heavy-doped region of the first type form a second bipolar transistor collector, a second bipolar transistor base, and a second bipolar transistor emitter, respectively.

15. The protection circuit of claim 1, wherein said second low-voltage gate trigger silicon controlled rectifier is located on a substrate of a first type, the substrate of the first type including:

a third well of a second type, located on the substrate of the first type;

a fourth well of the first type, located on the substrate of the first type, adjacent to said third well of the second type;

a fourth well of the second type, located on the substrate of the first type, adjacent to said fourth well of the first type;

a plurality of heavy-doped regions of the first type, sequentially spaced apart for a distance between each other, located on said third well of the second type;

a plurality of gate structures, each having a gate oxide and a gate electrode, located on the space of said third well of the second type between both of said heavy-doped regions of the first type;

a third heavy-doped region of the second type, located on said fourth well of the second type;

a third heavy-doped region of the first type, located on a junction of said third well of the second type and said fourth well of the first type;

a second heavy-doped region of the first type, located on said third well of the second type, spaced apart of said third heavy-doped region of the first type for a distance; and a second gate structure, having a gate oxide and a gate electrode, located between said second heavy-doped region of the first type and said third heavy-doped region of the first type.

16. The protection circuit of claim 15, wherein said third well of the second type, the substrate of the first type and said fourth well of the second type form a third bipolar transistor collector, a third bipolar transistor base, and a third bipolar transistor emitter of a third bipolar transistor, respectively.

17. The protection circuit of claim 15, wherein the substrate of the first type, said third well of the second type and said second heavy-doped region of the first type form a fourth bipolar transistor collector, a fourth bipolar transistor base, and a fourth bipolar transistor emitter, respectively.

18. The protection circuit of claim 15, wherein said fourth well of the second type and the substrate of the first type form a diode.

19. The protection circuit of claim 1, wherein said third low-voltage gate trigger silicon controlled rectifier is located on a substrate of a first type, the substrate of the first type including:

a fifth well of a second type located on the substrate of the first type;

a sixth well of the first type located on the substrate of the first type, adjacent to said fifth well of the second type;

a sixth well of the second type located on the substrate of the first type, adjacent to said sixth well of the first type;

a seventh well of the first type located on the substrate of the first type, adjacent to said sixth well of the second type;

a plurality of heavy-doped regions of the second type, sequentially spaced apart for a distance between each other, located on said seventh well of the first type;

a plurality of gate structures, each having a gate oxide and a gate electrode, located on the space of said seventh well of the first type between both of said heavy-doped regions of the second type;

a fourth heavy-doped region of the first type, located on said fifth well of the second type;

a fourth heavy-doped region of the second type, located on a junction of said sixth well of the first type and said sixth well of the second type;

a fifth heavy-doped region of the second type, located on a junction of said fifth well of the second type and said sixth well of the first type; and a third gate structure, having a gate oxide and a gate electrode, located between said fourth heavy-doped region of the second type and said fifth heavy-doped region of the second type.

20. The protection circuit of claim 19, wherein said fifth well of the second type, the substrate of the first type and said sixth well of the second type form a fifth bipolar transistor collector, a fifth bipolar transistor base, and a fifth bipolar transistor emitter, respectively.

21. The protection circuit of claim 19, wherein the substrate of the first type, said fifth well of the second type and said fourth heavy-doped region of the first type form a sixth bipolar transistor collector, a sixth bipolar transistor base, and a sixth bipolar transistor emitter, respectively.

22. The protection circuit of claim 12, wherein the first type is N type and the second type is P type.

23. The protection circuit of claim 12, wherein the first type is P type and the second type is N type.

24. The protection circuit of claim 15, wherein the first type is N type and the second type is P type.

25. The protection circuit of claim 15, wherein the first type is P type and the second type is N type.

26. The protection circuit of claim 19, wherein the first type is N type and the second type is P type.

27. The protection circuit of claim 19, wherein the first type is P type and the second type is N type.

28. A protection circuit, located on a wire between an internal circuit and a pad, for preventing the internal circuit from damage due to electrostatic discharge, through the pad, comprising:

a reference high potential;

a reference low potential;

a first low-voltage gate trigger silicon controlled rectifier, having a first low-voltage gate trigger silicon controlled rectifier anode, a first low-voltage gate trigger silicon controlled rectifier anode gate, a first low-voltage gate trigger silicon controlled rectifier cathode, a first low-voltage gate trigger silicon controlled rectifier cathode gate, and a first low-voltage gate trigger silicon controlled rectifier trigger gate, for protecting the internal circuit against the effect of a negative drain mode and a negative source mode of electrostatic discharge;

a second low-voltage gate trigger silicon controlled rectifier, having a second low-voltage gate trigger silicon controlled rectifier, anode, a second low-voltage gate trigger silicon controlled rectifier anode gate, a second low-voltage gate trigger silicon controlled rectifier cathode, a second low-voltage gate trigger silicon controlled rectifier cathode gate, and a second low-voltage gate trigger silicon controlled rectifier trigger gate, for protecting the internal circuit against the effect of a positive source mode and a positive drain mode of electrostatic discharge; and a current-limiting resistor for protection against unexpected electrostatic discharge, wherein, the first low-voltage gate trigger silicon controlled rectifier anode, the first low-voltage gate trigger silicon controlled rectifier anode gate and the second low-voltage gate trigger silicon controlled rectifier anode gate are each coupled to said reference high potential, the first low-voltage gate trigger silicon controlled rectifier cathode gate and the second low-voltage gate trigger silicon controlled rectifier cathode and the second low-voltage gate trigger silicon controlled rectifier cathode gate are each coupled to said reference low potential, the first low-voltage gate trigger silicon controlled rectifier cathode and the second low-voltage gate trigger silicon controlled rectifier anode are each coupled to said wire, and said current-limiting resistor is connected between the pad and a linked terminal of a trigger gates of said first low-voltage gate trigger silicon controlled rectifier and a linked terminal of trigger gates of said second low-voltage gate trigger silicon controlled rectifier.

29. A method for preventing a semiconductor circuit from damage due to electrostatic discharge through a semiconductor pad comprising the steps of:

coupling to a reference high potential a first low-voltage gate trigger silicon controlled rectifier anode, a first low-voltage gate trigger silicon controlled rectifier anode gate, a second low-voltage gate trigger silicon controlled rectifier anode gate and a third low-voltage gate trigger silicon controlled rectifier anode gate;

coupling to a reference low potential a second low-voltage gate trigger silicon controlled rectifier cathode, a second low-voltage gate trigger silicon controlled rectifier cathode gate and a third low-voltage gate trigger silicon controlled rectifier anode;

coupling to a wire connected between said semiconductor pad and said semiconductor circuit a first low-voltage gate trigger silicon controlled rectifier cathode, a second low-voltage gate trigger silicon controlled rectifier anode and a third low-voltage gate trigger silicon controlled rectifier cathode; and connecting a current-limiting resistor between the pad and a linked terminal of trigger gates of said first low-voltage gate trigger silicon controlled rectifier, a linked terminal of trigger gates of said second low-voltage gate trigger silicon controlled rectifier and a linked terminal of trigger gates of said third low-voltage gate trigger silicon controlled rectifier.

* * * * *